United States Patent [19]

Hirai et al.

[11] Patent Number: 4,469,801
[45] Date of Patent: Sep. 4, 1984

[54] TITANIUM-CONTAINING SILICON NITRIDE FILM BODIES AND A METHOD OF PRODUCING THE SAME

[75] Inventors: Toshio Hirai, 4-91, Takamori 3-Chome, Izumi City; Shinsuke Hayashi, 4-1-1501, Sakuragaoka-Koen, Sendai City, both of Japan; Akira Ohkubo, Sendai, Japan

[73] Assignees: Toshio Hirai; Shinsuke Hayashi, both of Japan

[21] Appl. No.: 298,109

[22] Filed: Aug. 31, 1981

[30] Foreign Application Priority Data

Sep. 4, 1980 [JP] Japan ............................. 55-121690

[51] Int. Cl.³ ............................................... B32B 9/00
[52] U.S. Cl. ..................................... 501/96; 428/446; 428/698; 428/408; 252/502
[58] Field of Search ............... 428/446, 408, 688, 698; 427/94, 95, 49; 423/344, 345, 346, 324; 252/502; 501/97, 96

[56] References Cited

U.S. PATENT DOCUMENTS

| 4,145,224 | 3/1979 | Mehalchick et al. | 501/97 |
| 4,178,415 | 12/1979 | Ovshinsky et al. | 428/446 |
| 4,208,215 | 6/1980 | Kleiner et al. | 501/97 |
| 4,216,021 | 8/1980 | Hattori et al. | 501/97 |
| 4,312,899 | 1/1982 | Lahmann | 428/446 |
| 4,312,924 | 1/1982 | Hirai et al. | 428/446 |

Primary Examiner—William R. Dixon, Jr.
Assistant Examiner—E. Rollins Buffalow
Attorney, Agent, or Firm—Parkhurst & Oliff

[57] ABSTRACT

Titanium-containing silicon nitride film bodies include a film body having an essentially amorphous structure and containing particle-like titanium nitride, a film body consisting mainly of α-type crystal and containing particle-like TiN deposited in the crystal and having a crystal orientation of crystal face (OO1), and a film body consisting mainly of β-type crystal and containing column-like TiN deposited in the crystal along the c-axis direction thereof and having a crystal orientation of crystal face (OO1), which are produced by blowing a nitrogen depositing source, a silicon depositing source and a titanium depositing source on a substrate heated at 500°–1,900° C. by means of a blowpipe composed of a pipe assembly to perform chemical vapordeposition reaction.

2 Claims, 13 Drawing Figures

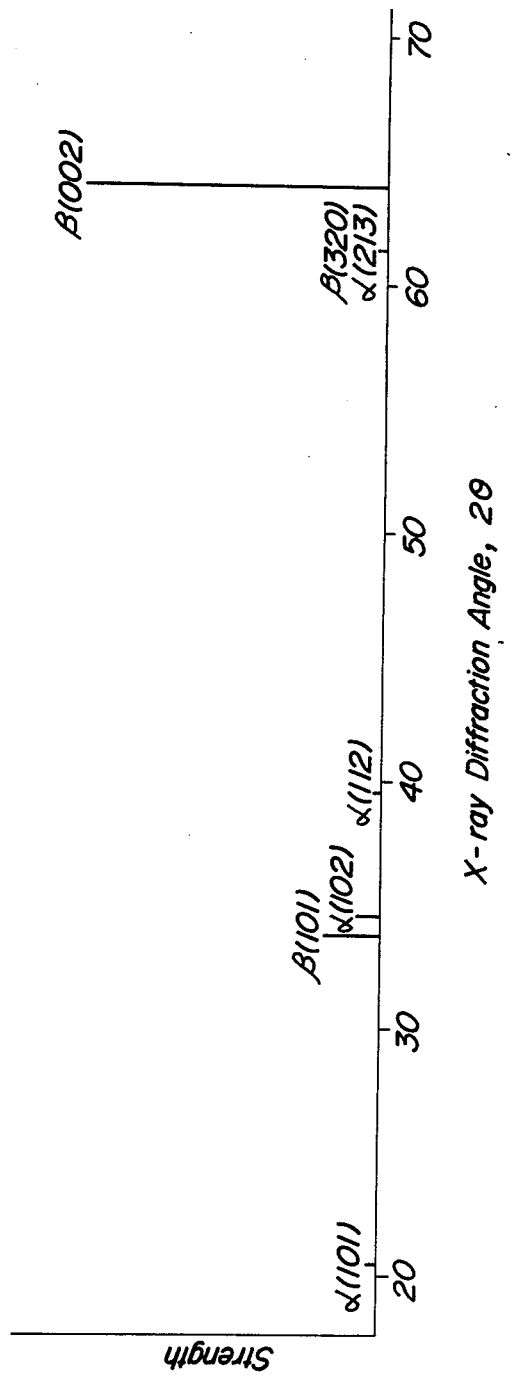

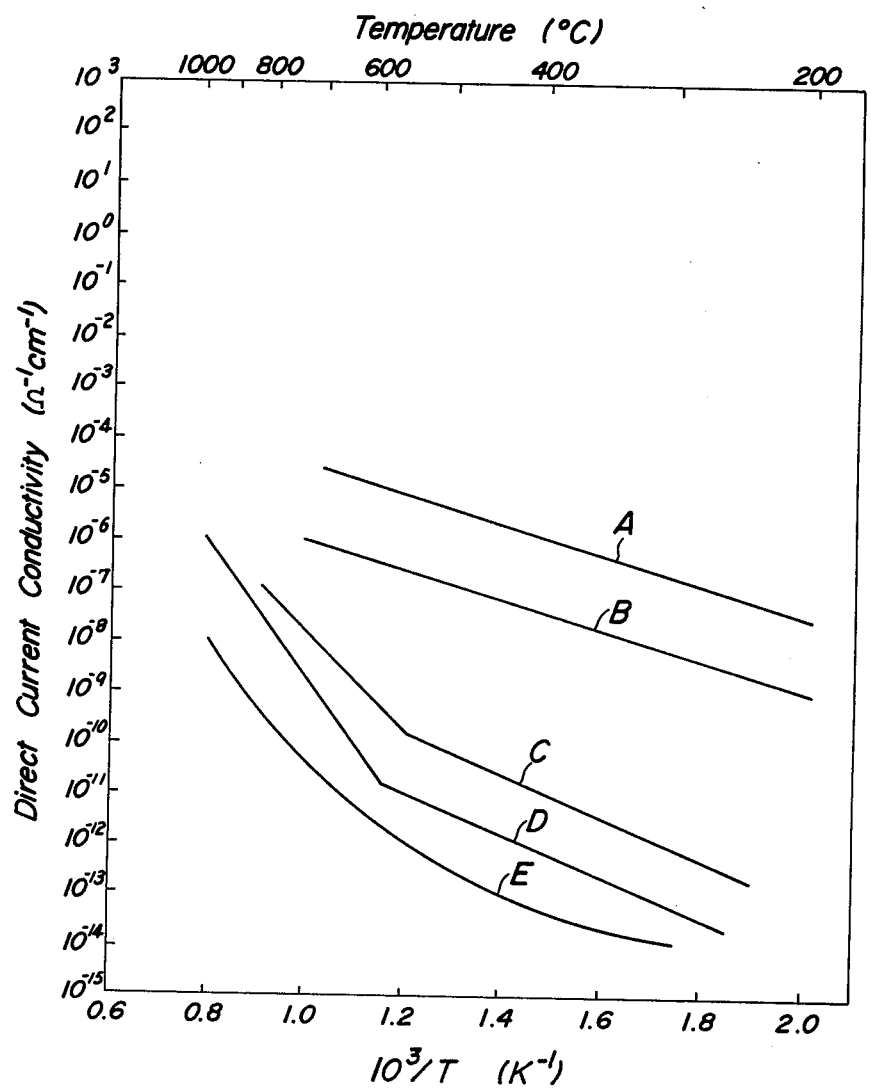

FIG. 6
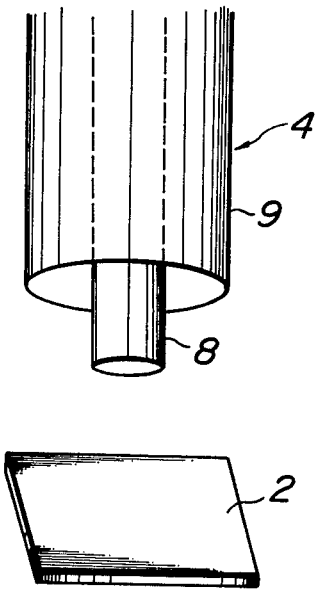
FIG. 7
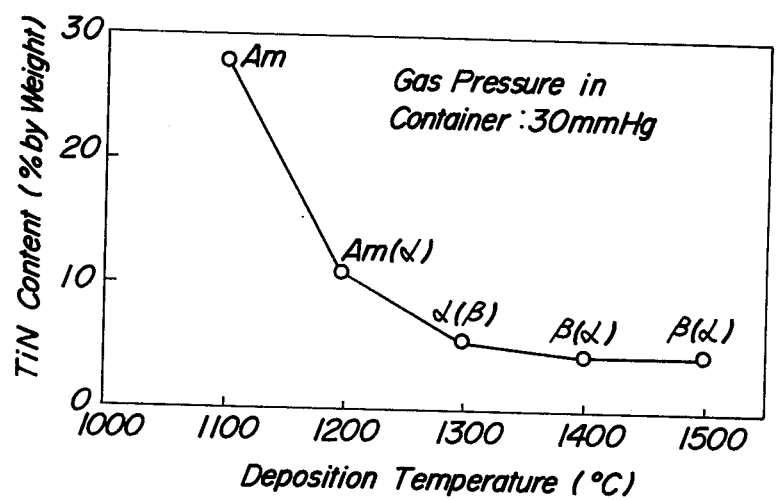

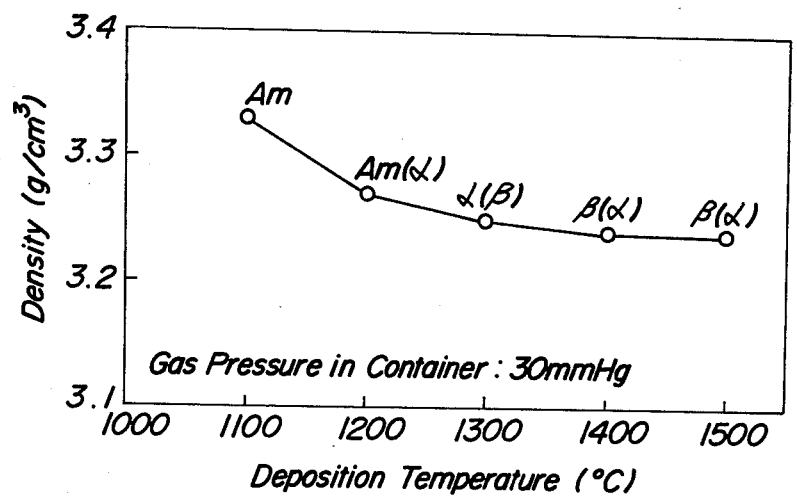
FIG_8
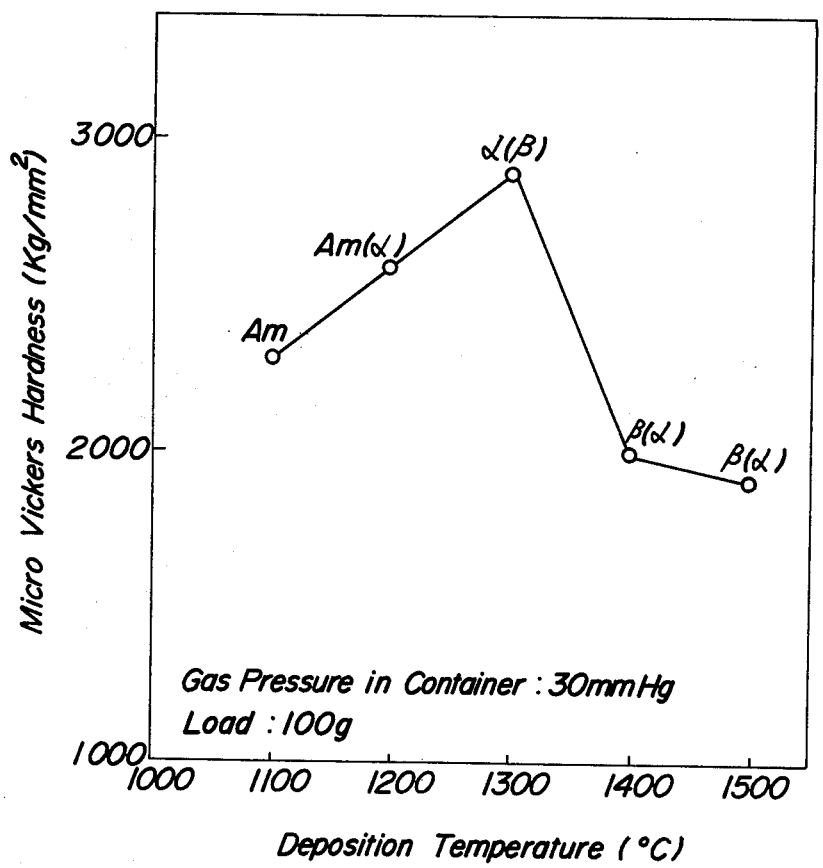
FIG_9

4,469,801

TITANIUM-CONTAINING SILICON NITRIDE FILM BODIES AND A METHOD OF PRODUCING THE SAME

BACKGROUND OF THE INVENTION

1. Field of the Invention:

The present invention relates to titanium-containing silicon nitride film bodies and a method of producing the same, and more particularly to titanium-containing silicon nitride film bodies produced by chemical vapor-deposition and a method of producing the same.

2. Description of the Prior Art:

Heretofore, it has been known to produce silicon nitride by a chemical vapor-deposition process. In this case, as a starting material gas, use is made of a silicon-containing gas for the silicon depositing source of vapor deposition, such as $SiCl_4$, $SiH_4$, $SiBr_4$, $SiF_4$ or the like, and a nitrogen-containing gas for nitrogen depositing source of vapor deposition, such as $NH_3$, $N_2H_4$ or the like. That is, it has been known that when the above two kinds of starting material gases are reacted with each other under a reduced pressure and at a high temperature, silicon nitride is produced, and in this case, if a carbon plate is present as a substrate, silicon nitride can be deposited on the carbon plate in the form of a plate to obtain an amorphous or crystalline silicon nitride film body.

In addition, besides the silicon nitride film body, it has also been known that amorphous silicon nitride powder can be produced by the change of the deposition conditions.

Moreover, U.S. Pat. No. 4,145,224 discloses that titanium-containing silicon nitride is obtained in the form of powder by the chemical vapor-deposition process. That is, according to this patent specification, a TiN-containing amorphous silicon nitride powder is obtained by introducing $SiCl_4$, $TiCl_4$ and $NH_3$ into a reaction zone at a temperature of 1,100° C. to 1,350° C. Further, there is disclosed that a heat treating temperature of 1,500° C. to 1,600° C. is required to crystallize an amorphous silicon nitride powder containing no TiN, while when the TiN-containing amorphous silicon nitride powder is heat-treated in nitrogen gas atmosphere at a temperature as low as 1,400° C. for 2 hours, 60% by weight of the TiN-containing amorphous silicon nitride powder is crystallized, and the resulting crystal consists of 97% by weight of α-type silicon nitride and 3% by weight of β-type silicon nitride. In addition, the titanium content is preferably 1.5 to 5% by weight, but even if the titanium content is 0.01% by weight, amorphous silicon nitride can be crystallized at a temperature of 1,400° C.

According to the above patent specification, there is further described that the resulting deposited Ti-containing silicon nitride is powder, and in order to make it a film body, it is necessary to sinter the powdery deposited product in a mold.

SUMMARY OF THE INVENTION

It is, therefore, an object of the present invention to provide a titanium-containing silicon nitride film body having an essentially amorphous structure and containing particle-like titanium nitride, a Ti-containing silicon nitride film body which consists mainly of α-type crystal, contains particle-like TiN deposited in this crystal and has a crystal orientation of a crystal face (OOl) of the α-type crystal, a Ti-containing silicon nitride film body which consists mainly of β-type crystal, contains column-like TiN deposited in this crystal along the c-axis direction thereof and has a crystal orientation of a crystal face (OOl) of the β-type crystal, and a process for producing the same, which have never been known up to the present.

BRIEF DESCRIPTION OF THE DRAWINGS

The invention will now be described in greater detail with reference to the accompanying drawings, wherein:

FIG. 2 is an X-ray diffraction pattern of the deposited surface of the Ti-containing $Si_3N_4$ according to the invention consisting mainly of β-type crystal, wherein the crystal face (OOl) is oriented in parallel to the substrate;

FIGS. 3A and 3B are scanning electron microscope photographs of the Ti-containing $Si_3N_4$ according to the invention, wherein FIG. 3A shows $Si_3N_4$ consisting mainly of α-type crystal whose crystal face (OOl) is oriented in parallel to the substrate and FIG. 3B shows $Si_3N_4$ consisting mainly of β-type crystal whose crystal face (OOl) is oriented in parallel to the substrate, respectively;

FIGS. 4A and 4B are high-resolution electron microscope photographs of the Ti-containing $Si_3N_4$ according to the invention, wherein FIG. 4A shows a c-plane of the β-type $Si_3N_4$ and FIG. 4B shows a plane inclusive of c-axis thereof, respectively;

FIG. 5 is a graph showing the relation between the direct current conductivity and the temperature in the Ti-containing $Si_3N_4$ according to the invention and the $Si_3N_4$ containing no Ti;

FIG. 6 is a perspective view of the blowpipe used for carrying out the invention;

FIG. 7 is a graph showing the relation between the TiN content of Ti-containing $Si_3N_4$ according to the invention and the deposition temperature;

FIG. 8 is a graph showing the relation between the density of the Ti-containing $Si_3N_4$ according to the invention and the deposition temperature;

FIG. 9 is a graph showing the relation between the hardness of the Ti-containing $Si_3N_4$ according to the invention at a room temperature and the deposition temperature;

DETAILED DESCRIPTION OF THE INVENTION

Figure 1:
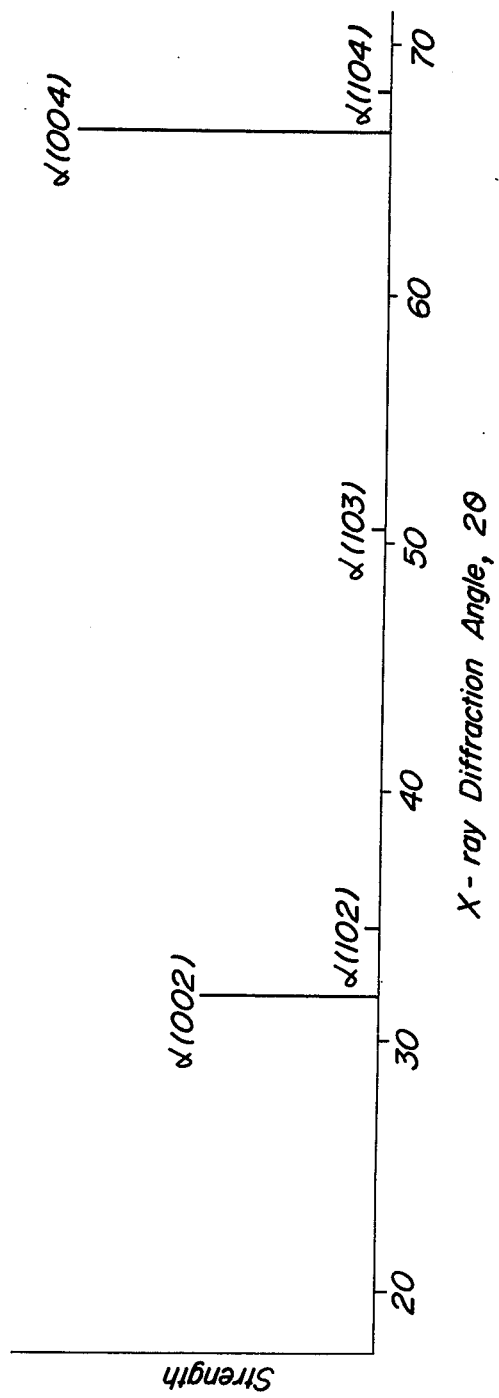
FIG. 1 is an X-ray diffraction pattern of the deposited surface of the Ti-containing $Si_3N_4$ according to the invention consisting mainly of α-type crystal, wherein the crystal face (OOl) is oriented in parallel to the substrate.

The first aspect of the present invention lies in a titanium-containing silicon nitride film body having an essentially amorphous structure and containing particle-like titanium nitride.

As previously mentioned, an essentially amorphous Ti-containing silicon nitride powder has been known, and a crystalline Ti-containing silicon nitride sintered body has also been known, but the Ti-containing silicon nitride film body having an essentially amorphous structure and containing particle-like titanium nitride according to the first aspect of the invention has not yet been known. Because, the above U.S. Pat. No. 4,145,224 discloses that the amorphous Ti-containing silicon nitride powder is obtained, and when this powder is sintered in a mold, the Ti-containing crystalline silicon nitride sintered body is obtained. Therefore, the sintered body of this patent specification is different from the film body according to the first aspect of the invention in the point of amorphous structure.

The film body according to the first aspect of the invention is produced by vapor-deposition, but by limiting the production conditions, it is possible to produce two kinds of a Ti-containing silicon nitride (hereinafter silicon nitride is referred to as $Si_3N_4$) film body having only a substantially amorphous structure and a Ti-containing $Si_3N_4$ film body having an essentially amorphous structure and containing a small amount of $\alpha$-type crystal, but it is a matter of course that these two kinds of film bodies are entirely unknown.

The Ti-containing $Si_3N_4$ film bodies according to the second and third aspects of the present invention have also not been known at all. As seen from the above patent specification, the crystal form of $Si_3N_4$ contained in the sintered body is indistinct. On the contrary, the film body according to the second aspect of the present invention lies in a Ti-containing $Si_3N_4$ film body consisting mainly of $\alpha$-type crystal and containing particle-like TiN deposited in this crystal and having a crystal orientation of a crystal face (OOl) of the $\alpha$-type crystal, and the film body according to the third aspect of the present invention lies in a Ti-containing $Si_3N_4$ film body consisting mainly of $\beta$-type crystal and containing column-like TiN deposited in this crystal along the c-axis direction thereof and having a crystal orientation of a crystal face (OOl) of the $\beta$-type crystal. Such film bodies are entirely novel.

The structure, properties and nature of the Ti-containing $Si_3N_4$ film body according to the invention will be explained as follows.

The film body according to the first aspect of the invention is substantially amorphous or has an essentially amorphous structure and contains a small amount, for instance, not more than about 10% by weight, of $\alpha$-type crystal as described above. In this case, titanium is contained as TiN, and its content as TiN is within a range of 5 to 30% by weight per the total amount of the film body. The Ti content can be controlled by the change of the production conditions as explained later on. Moreover, TiN is dispersed in the amorphous film body as a fine particle having a particle size of not more than about 30 Å.

Figure 3A:

The film body according to the second aspect of the invention consists mainly of $\alpha$-type crystal and contains TiN fine particles having a particle size of not more than about 100 Å, which are deposited in this crystal. Further, the crystal face (OOl) of $\alpha$-type crystal is well oriented in the film body as shown in the X-ray diffraction pattern of FIG. 1. This crystal orientation is coincident with the growth state of $\alpha$-type $Si_3N_4$ as shown in the scanning electron microscope photograph of FIG. 3A.

Figure 3B:

The film body according to the third aspect of the invention consists mainly of $\beta$-type crystal and contains column-like TiN deposited in this crystal along the c-axis direction thereof. Further, the crystal face (OOl) of the $\beta$-type crystal is excellently oriented in the film body as shown in the X-ray diffraction pattern of FIG. 2. This crystal orientation is well coincident with the laminated structure of plate-like c-planes of $\beta$-type $Si_3N_4$ as shown in the scanning electron microscope photograph of FIG. 3B.

Figure 4A:
Figure 4B:
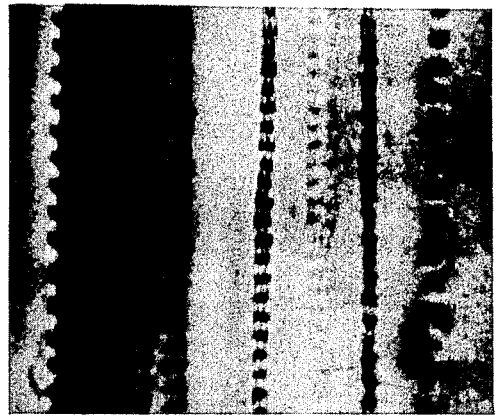

In the film body according to the third aspect of the invention, Ti is present as TiN. In this case, as shown in the high-resolution electron microscope photograph of FIG. 4A for the c-plane of $\beta$-type $Si_3N_4$ and the high-resolution electron microscope photograph of FIG. 4B for the plane inclusive of c-axis of $\beta$-type $Si_3N_4$, TiN is deposited as a columnar inclusion having a diameter of not more than about 100 Å and extended in the c-axis direction of $\beta$-type $Si_3N_4$. The TiN content of the film body varies in accordance with the conditions for producing this film body, particularly the deposition temperature as mentioned below, but is within a range of 4 to 5% by weight.

The density of the film body according to the invention varies in accordance with the production conditions, but is within a range of 3.24 to 3.35 g/cm$^3$. The theoretical density of $\alpha$-type $Si_3N_4$ is 3.18 g/cm$^3$, that of $\beta$-type $Si_3N_4$ is 3.19 g/cm$^3$, and that of TiN is 5.43 g/cm$^3$, respectively, so that the density rises as the TiN content rises.

The hardness (load: 100 g) of the film body according to the invention at a room temperature is within a range of 1,900 to 2,900 kg/mm$^2$ and varies in accordance with the temperature when the film body is produced as described later on. The film body having the above defined hardness according to the invention can satisfactorily be used as a cutting tool.

The Ti-containing $Si_3N_4$ according to the invention has higher electric conductivity than the pure $Si_3N_4$ film body. For example, as shown in FIG. 5, the direct current conductivity of the Ti-containing amorphous $Si_3N_4$ (A) at 300° C. is higher than that of the $\alpha$-type crystalline $Si_3N_4$ (E) containing no Ti at the same temperature by 10$^7$, and is characterized by having a small temperature coefficient of the electric conductivity. Having the above direct current conductivity and special temperature coefficient of the electric conductivity, the film body according to the invention can be expected to be applied to electric materials by utilizing these properties. In FIG. 5, reference letter A represents the Ti-containing amorphous $Si_3N_4$, reference letter B the Ti-containing $\alpha$-type crystalline $Si_3N_4$, reference letter C the Ti-containing $\beta$-type crystalline $Si_3N_4$, reference letter D the amorphous $Si_3N_4$ containing no Ti, and reference letter E the $\alpha$-type crystalline $Si_3N_4$ containing no Ti.

The method of producing the film body according to the invention will be explained with reference to FIG. 6.

According to the invention, a gaseous nitrogen depositing source, a gaseous silicon depositing source and a gaseous titanium depositing source are blown on a substrate 2 heated at a temperature of from 500° C. to 1,900° C. by means of a blowpipe composed of a pipe assembly 4 in which the gas stream for the nitrogen depositing source blown on the substrate 2 is surrounded with a mixed gas stream of the gaseous silicon depositing source and the gaseous the titanium depositing source, and chemical vapor deposition reaction of these gases is caused on or near the substrate 2 so as to produce Ti-containing $Si_3N_4$, whereby a Ti-containing $Si_3N_4$ film body can be deposited on the substrate.

In addition, it is advantageous that at least an end portion of the blowpipe and the substrate are set in an airtightly closable container which can regulate atmosphere and pressure.

As the silicon depositing source for producing the Ti-containing $Si_3N_4$ according to the invention, use may be made of at least one compound selected from silicon halides (e.g., $SiCl_4$, $SiF_4$, $SiBr_4$, $SiI_4$, $Si_2Cl_6$, $Si_2Br_6$, $Si_2I_6$, $SiBrCl_3$, $SiBr_3Cl$, $SiBr_2Cl_2$, $SiICl_3$), silicon hydrides (e.g., $SiH_4$, $Si_4H_{10}$, $Si_3H_8$, $Si_2H_6$), and silicon hydrogen halides (e.g., $SiHCl_3$, $SiHBr_3$, $SiHF_3$, $SiHI_3$). Among them, gaseous $SiH_4$ at room temperature, or $SiHCl_3$ and $SiCl_4$ having higher vapor pressure at room temperature may preferably be used. As the nitrogen depositing source, use may be made of at least one compound selected from nitrogen hydrides (e.g., $HN_3$, $NH_3$, $N_2H_4$) and ammonium halides (e.g., $NH_4Cl$, $NH_4F$, $NH_4HF_2$, $NH_4I$). Among them, $NH_3$ and $N_2H_4$ are preferably used because they are relatively cheap and commercially available. As the titanium depositing source, use may be made of at least one compound selected from titanium halides (e.g., $TiCl_4$, $TiBr_4$, $TiF_4$, $TiI_4$). Among them, $TiCl_4$ is preferably used because it is relatively cheap and commercially available.

The temperature of the substrate for producing the Ti-containing $Si_3N_4$ from the silicon depositing source, the titanium depositing source and the nitrogen depositing source is within a range of 500° to 1,900° C., preferably 1,000° to 1,600° C.

In order to transfer one or two of the nitrogen depositing source, the silicon depositing source and the titanium depositing source, at least one of $N_2$, Ar, He and $H_2$ can be used as a carrier gas, if necessary. Among them, $N_2$ may also act as the nitrogen depositing source, and $H_2$ may take part in the chemical vapor-deposition reaction of the silicon and titanium depositing sources. The carrier gas is used for an adjustment of total gas pressure in the container accommodating the substrate, an adjustment of a mixing vapor ratio of the silicon, titanium and nitrogen depositing sources, an adjustment of the pattern of gas streams in the container, and/or a partial contribution to the reaction of, for example, $N_2$ and $H_2$. However, Ti-containing $Si_3N_4$ can be produced without using any carrier gas.

Next, the production of Ti-containing $Si_3N_4$ will be described using $SICl_4$, $TiCl_4$ and $NH_3$ as starting materials and $H_2$ as a carrier gas.

Each of $SiCl_4$, $TiCl_4$ and $NH_3$ is introduced into a container through the pipe assembly 4 as shown in FIG. 6, in which $NH_3$ gas is fed into an inner pipe 8 of the pipe assembly 4, and a mixed gas of $SiCl_4$ and $TiCL_4$ is fed into an outer pipe 9 thereof, whereby these gases are blown on the substrate 2 in the container while surrounding the gas stream of $NH_3$ with the mixed gas of $SiCl_4$ and $TiCl_4$. In this case, the carrier gas $H_2$ is also blown through the outer pipe 9, so that it is advantageous to previously mix $H_2$ with the $SiCl_4$ and $TiCl_4$.

The flow amount of $H_2$ is preferably within a range of 100 to 7,000 cc/min, more particularly 1,000 to 4,000 cc/min. The flow amount of $SiCl_4$ (vapor state) is preferably within a range of 20 to 1,000 cc/min, more particularly 50 to 500 cc/min. The flow amount of $TiCl_4$ (vapor state) is preferably within a range of 0.1 to 100 cc/min, more particularly 1 to 50 cc/min. The flow amount of $NH_3$ is preferably within a range of 50 to 500 cc/min, more particularly 80 to 400 cc/min.

The total gas pressure in the container accommodating the substrate 2 is preferably within a range of 1 to 760 mmHg, more particularly 5 to 100 mmHg. Moreover, the Ti-containing $Si_3N_4$ according to the invention can be produced even if the gas pressure is more than 1 atm.

There will now be explained the relation between the production conditions for producing a film body according to the invention and the resulting film body.

Table 1 is an example showing the influence of the deposition temperature upon the crystal state of $Si_3N_4$ in the production of the Ti-containing $Si_3N_4$ film body according to the invention and the $Si_3N_4$ film body containing no Ti. As the production conditions other than the deposition temperature, in case of the Ti-containing $Si_3N_4$, the gas pressure in the container is 30 mmHg, the flow amount of $SiCl_4$ is 136 cc/min (vapor state), the flow amount of $TiCl_4$ is 18 cc/min (vapor state), the flow amount of $NH_3$ is 120 cc/min, and the flow amount of $H_2$ is 2,720 cc/min, while in case of the $Si_3N_4$ containing no Ti, the gas pressure in the container is 30 mmHg, the flow amount of $SiCl_4$ is 136 cc/min (vapor state), the flow amount of $NH_3$ is 120 cc/min, and the flow amount of $H_2$ is 2,720 cc/min.

TABLE 1

An example showing relation between deposition temperature and crystal state of $Si_3N_4$

| | Crystal state | |
| --- | --- | --- |
| | Ti-containing $Si_3N_4$ | $Si_3N_4$ containing no Ti |
| 1,100° C. | amorphous | amorphous |
| 1,200° C. | amorphous + α-type crystal (amorphous > α) | amorphous |
| 1,300° C. | α-type crystal + β-type crystal (α > β) | amorphous |
| 1,400° C. | α-type crystal + β-type crystal (β > α) | amorphous |
| 1,500° C. | α-type crystal + β-type crystal (β > α) | amorphous + α-type crystal |

As can be seen from Table 1, when Ti-containing $Si_3N_4$ is compared with the $Si_3N_4$ containing no Ti, the deposition temperature for producing α-type crystal is lowered by 300° C., and β-type crystal, which has been difficult to be produced by the conventional chemical vapor-deposition process, can easily be produced.

According to the invention, as shown in FIG. 7, the TiN content in the film body is 28% by weight when the deposition temperature is 1,100° C., but is reduced to 4.2% by weight when the deposition temperature is further raised to 1,500° C. In FIG. 7, reference letter Am represents an amorphous structure, reference letter α represents an α-type crystal and reference letter β represents a β-type crystal.

The density of Ti-containing $Si_3N_4$ according to the invention, as shown in FIG. 8, is reduced from 3.33 g/cm³ at the deposition temperature of 1,100° C. to 3.25 g/cm³ at the deposition temperature of 1,500° C. as the deposition temperature rises. These density values are higher than the theoretical density of α-type $Si_3N_4$ of 3.18 g/cm³ and the theoretical density of β-type $Si_3N_4$ of 3.19 g/cm³, because TiN (theoretical density: 5.43 g/cm³) is contained.

There now will be explained the relation between the deposition temperature and the micro Vickers hardness in the production of the film body according to the invention with reference to FIG. 9. As can be seen from FIG. 9, the higher the deposition temperature, the larger the hardness as the deposition temperature increases up to 1,300° C., but when the deposition temperature exceeds 1,300° C., the hardness decreases.

Figure 10:
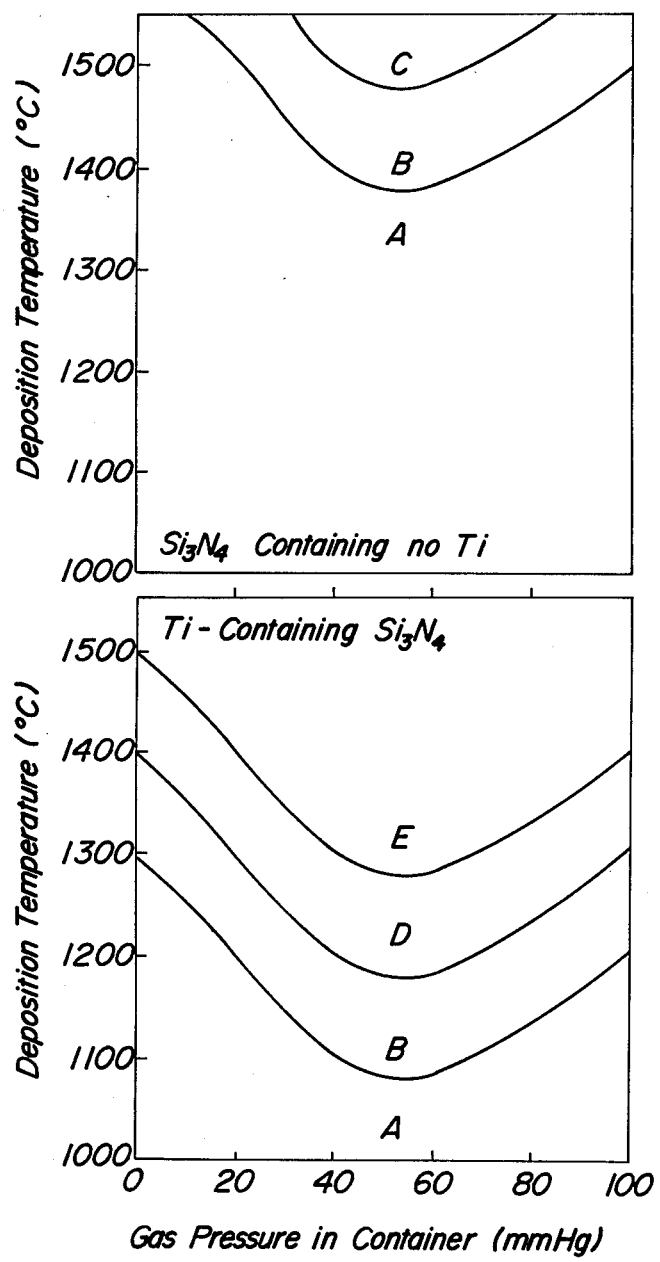
FIG. 10 is a graph showing the influence of the deposition temperature and the gas pressure in the container on the crystal form of $Si_3N_4$.

In FIG. 10 is shown the influence of the deposition temperature and the gas pressure in the container upon the crystal state of the film body in the production of the Ti-containing $Si_3N_4$ film body according to the invention and the $Si_3N_4$ film body containing no Ti. In FIG. 10, reference letter A represents an amorphous structure, reference letter B an amorphous structure $+\alpha$-type crystal, reference letter C an $\alpha$-type crystal, reference letter D an $\alpha$-type crystal $+\beta$-type crystal ($\alpha>\beta$), and reference letter E an $\alpha$-type crystal $+\beta$-type crystal ($\alpha<\beta$). From this figure, it is understood that the Ti-containing $Si_3N_4$ film bodies A, B, D and E according to the invention can be produced at a lower deposition temperature as compared with the $Si_3N_4$ film body containing no Ti.

The following examples are given in illustration of the invention and are not intended as limitations thereof.

EXAMPLE 1

Figure 11:
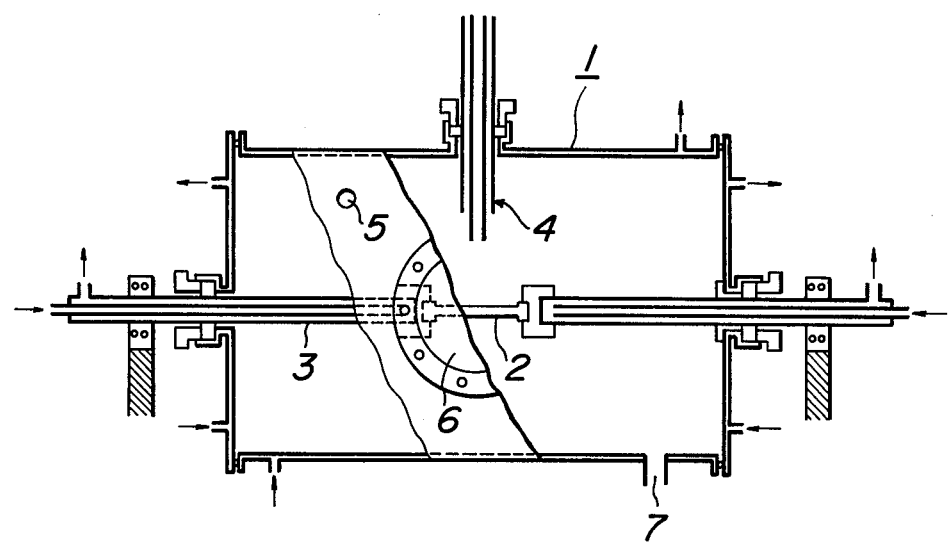
FIG. 11 is a partially broken cross-sectional view of an embodiment of the apparatus for producing the Ti-containing $Si_3N_4$ according to the invention.

The production of Ti-containing $Si_3N_4$ was effected by using the apparatus shown in FIG. 11. A plated substrate 2 of artificial graphite was placed in a container 1 and clamped between copper electrodes 3 and thereafter air in the container was exhausted to a vacuum degree of $10^{-3}$ mmHg. Then, the substrate was heated above 500° C. by supplying an electric current to the electrodes so as to remove gases from the substrate and further heated and maintained at 1,100° C. Onto the heated substrate were blown gases of starting materials through a blowpipe 4 in such a manner that ammonia gas was passed at a flow rate of 120 cc/min through an inner pipe, while mixed gas of hydrogen gas (flow rate: 1,360 cc/min) passed through silicon tetrachloride (vapor pressure: 76 mmHg) at 0° C. and hydrogen gas (flow rate: 1,360 cc/min) passed through titanium tetrachloride (vapor pressure: 10 mmHg) at 20° C. was flowed out of an outer pipe. In this case, a gas pressure in the container was 30 mmHg. After these gases were flowed for 8 hours, the supply of electric current was stopped and the substrate 2 after cooling was removed from the container. Thus, a platelike and black Ti-containing $Si_3N_4$ having a thickness of 0.7 mm was deposited on the surface of the substrate 2. The properties of this Ti-containing $Si_3N_4$ were as follows:

| Crystal structure | amorphous |
|---|---|
| Density | 3.33 g/cm$^3$ |
| TiN content | 28% by weight |
| Hardness at room temperature | 2,300 kg/mm$^2$ (load: 100 g) |

EXAMPLE 2

The Ti-containing $Si_3N_4$ was produced by using the same apparatus and repeating the same procedure as described in Example 1. In this case, the temperature of the substrate was kept at 1,200° C., and onto the heated substrate was blown ammonia gas at a flow rate of 120 cc/min through the inner pipe, while mixed gas of hydrogen gas (flow rate: 1,360 cc/min) passed through silicon tetrachloride (vapor pressure: 76 mmHg) at 0° C. and hydrogen gas (flow rate: 1,360 cc/min) passed through titanium tetrachloride (vapor pressure: 10 mmHg) at 20° C. was flowed out of the outer pipe. Moreover, the gas pressure in the container was 30 mmHg. After these gases were flowed for 8 hours, the supply of electric current was stopped and the substrate 2 after cooling was removed from the container. Thus, the black Ti-containing $Si_3N_4$ having a thickness of 0.8 mm was deposited on the surface of the substrate 2. The properties of this Ti-containing $Si_3N_4$ were as follows:

| Crystal structure | the substrate side was $\alpha$-type crystal and the deposited surface side was amorphous |
|---|---|
| Density | 3.27 g/cm$^3$ |
| TiN content | 11% by weight |
| Hardness at room temperature | 2,600 kg/mm$^2$ (load: 100 g) |
| Direct current conductivity | $3 \times 10^{-5} \Omega^{-1}$cm$^{-1}$ (700° C.) |

EXAMPLE 3

The Ti-containing $Si_3N_4$ was produced by using the same apparatus and repeating the same procedure as described in Example 1. In this case, the temperature of the substrate was kept at 1,300° C., and onto the heated substrate was blown ammonia gas at a flow rate of 120 cc/min through the inner pipe, while mixed gas of hydrogen gas (flow rate: 1,360 cc/min) passed through silicon tetrachloride (vapor pressure: 76 mmHg) at 0° C. and hydrogen gas (flow rate: 1,360 cc/min) passed through titanium tetrachloride (vapor pressure: 10 mmHg) at 20° C. was flowed out of the outer pipe. The gas pressure in the container was 30 mmHg. After these gases were flowed for 8 hours, the supply of electric current was stopped and the substrate 2 after cooling was removed from the container. Thus, the black Ti-containing $Si_3N_4$ having a thickness of 1.7 mm was deposited on the surface of the substrate 2. The properties of this Ti-containing $Si_3N_4$ were as follows:

| Crystal structure | mixture of 92% by weight of $\alpha$-type crystal and 8% by weight of $\beta$-type crystal |
|---|---|
| Crystal orientation | crystal face (OOl) of $\alpha$-type crystal is oriented in parallel to the substrate |
| Density | 3.25 g/cm$^3$ |
| TiN content | 5.4% by weight |
| Hardness at room temperature | 2,900 kg/mm$^2$ (load: 100 g) |
| Direct current conductivity | $8 \times 10^{-7} \Omega^{-1}$cm$^{-1}$ (700° C.) |

EXAMPLE 4

The Ti-containing $Si_3N_4$ was produced by using the same apparatus and repeating the same procedure as described in Example 1. In this case, the temperature of the substrate was kept at 1,400° C., and onto the heated substrate was blown ammonia gas at a flow rate of 120 cc/min through the inner pipe, while mixed gas of hydrogen gas (flow rate: 1,360 cc/min) passed through silicon tetrachloride (vapor pressure: 76 mmHg) at 0° C. and hydrogen gas (flow rate: 1,360 cc/min) passed through titanium tetrachloride (vapor pressure: 1,360 cc/min) at 20° C. was flowed out of the outer pipe. The gas pressure in the container was 30 mmHg. After these gases were flowed for 4 hours, the supply of electric current was stopped and the substrate 2 after cooling was removed from the container. Thus, the black Ti-containing $Si_3N_4$ having a thickness of 1.6 mm was deposited on the surface of the substrate 2. The properties of this Ti-containing $Si_3N_4$ were as follows:

| | |
|---|---|
| Crystal structure | mixture of 91% by weight of $\beta$-type crystal and 9% by weight of $\alpha$-type crystal |
| Crystal orientation | crystal face (OO1) of $\beta$-type crystal is oriented in parallel to the substrate |
| TiN content | 4.3% by weight, and TiN was deposited in the form of a column along the c-axis direction of $\beta$-type $Si_3N_4$ |
| Density | 3.24 g/cm$^3$ |
| Hardness at room temperature | 2,000 kg/mm$^2$ (load: 100 g) |
| Direct current conductivity | $8 \times 10^{-9} \, \Omega^{-1}cm^{-1}$ (700° C.) |

In Table 2 is summarized each kind of production factors and their ranges for producing the Ti-containing $Si_3N_4$ according to the invention.

TABLE 2

| | |
|---|---|
| Deposition temperature | 500–1,900° C. |
| Gas pressure in container | 1–760 mmHg |
| SiCl$_4$ flow amount (vapor state) | 20–1,000 cc/min |
| TiCl$_4$ flow amount (vapor state) | 0.1–100 cc/min |
| NH$_3$ flow amount | 50–500 cc/min |
| H$_2$ flow amount | 100–7,000 cc/min |

The Ti-containing $Si_3N_4$ film bodies according to the invention will be expected to be utilized for the following applications due to the excellent properties described in the foregoing.

1. As a coating material:

(a) The life of tooling materials such as a bite, die, drill, cutter and the like can be prolonged by applying on the surface of the tooling materials, so that the maintenance of automatic working system becomes more easy.

(b) The wearing and high-temperature baking of machine parts requiring a wear resistance, such as a bearing, toothed wheel, rotating shaft and the like are prevented by applying on the surface of the machine part.

(c) By applying on the surface of various materials such as a metal, compound, ceramics, graphite and the like, the hardness is increased and mechanical properties at an elevated temperature are improved (for example, engine parts, turbine parts and the like).

(d) The conductivity is given to a substrate consisting of any insulating material by applying on the surface of the substrate.

(e) The generation of static electricity is prevented by applying on the surface of insulators.

2. As a block material:

(a) Useful as tooling materials such as a super hard bite, super hard die and the like.

(b) Usable as hard laboratory instruments requiring a higher hardness.

(c) Useful as a bearing, rotating shaft, sealing material and the like requiring a higher hardness at an elevated temperature.

(d) Usable as high-temperature structural materials, for example, engine parts, turbine parts and the like.

(e) Usable as light-weight and high-temperature heat elements, for example, a recording heat pen.

(f) Usable as a recorder of an electrostatic printing apparatus.

(g) Usable as a high-temperature filament.

(h) Usable as a high-temperature heat element.

What is claimed is:

1. A titanium-containing silicon nitride film body consisting mainly of $\alpha$-type crystal, containing particle-like titanium nitride deposited in said crystal, and having a crystal orientation of a crystal face (OO1) of said $\alpha$-type crystal.

2. A titanium-containing silicon nitride film body consisting mainly of $\beta$-type crystal, containing column-like titanium nitride deposited in said crystal along the c-axis direction thereof, and having a crystal orientation of a crystal face (OO1) of said $\beta$-type crystal.

* * * * *